United States Patent
Wong et al.

(10) Patent No.: US 6,719,518 B2
(45) Date of Patent: Apr. 13, 2004

(54) PORTABLE TUBE HOLDER APPARATUS

(75) Inventors: Peter Wong, Levittown, NY (US); Scott Allaway, Bridgewater, NJ (US); Andrew Plitz, Howell, NJ (US); Glen Schneider, Woodbridge, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/977,740

(22) Filed: Oct. 15, 2001

(65) Prior Publication Data

US 2003/0072640 A1 Apr. 17, 2003

(51) Int. Cl.$^7$ .................................................. B65H 5/00
(52) U.S. Cl. .................. 414/403; 221/197; 414/416.07; 414/810
(58) Field of Search ................. 414/331.01, 331.14, 414/403, 416.07, 609, 810; 221/197, 287

(56) References Cited

U.S. PATENT DOCUMENTS

| | | | | |
|---|---|---|---|---|
| 3,184,104 A | * | 5/1965 | De Domenico | 221/92 |
| 3,557,976 A | * | 1/1971 | Isobe | 214/16.4 |
| 4,098,383 A | * | 7/1978 | Carpman | 193/2 R |
| 4,124,132 A | * | 11/1978 | Pennings | 214/301 |
| 4,293,998 A | * | 10/1981 | Kawa et al. | 29/564.1 |
| 4,500,246 A | * | 2/1985 | Janisiewicz et al. | 414/414 |
| 4,599,026 A | * | 7/1986 | Feiber et al. | 414/126 |
| 4,618,305 A | * | 10/1986 | Cedrone et al. | 414/403 |
| 4,629,387 A | * | 12/1986 | Stillman et al. | 414/403 |
| 4,653,665 A | * | 3/1987 | Heisner et al. | 221/11 |
| 4,760,924 A | * | 8/1988 | Sato et al. | 209/573 |
| 4,761,106 A | * | 8/1988 | Brown et al. | 414/125 |
| 4,787,137 A | * | 11/1988 | Jeanmairet et al. | 29/740 |
| 4,862,578 A | * | 9/1989 | Holcomb | 29/564.1 |
| 4,915,571 A | * | 4/1990 | Toshihiko et al. | 414/414 |
| 5,117,963 A | * | 6/1992 | Thayer et al. | 198/395 |
| 5,165,837 A | * | 11/1992 | Schuppert, Jr. et al. | 414/417 |
| 5,246,328 A | * | 9/1993 | Schuppert, Jr. et al. | 414/417 |
| 5,279,415 A | * | 1/1994 | Edgley et al. | 206/713 |
| 5,307,011 A | * | 4/1994 | Tani | 324/158 F |
| 5,354,153 A | * | 10/1994 | Ottone et al. | 408/1 R |
| 5,509,574 A | * | 4/1996 | Lenz et al. | 221/197 |
| 5,645,393 A | * | 7/1997 | Ishii | 414/417 |
| 5,733,093 A | * | 3/1998 | Palm et al. | 414/417 |
| 5,772,387 A | * | 6/1998 | Nakamura et al. | 414/416.01 |
| 5,862,918 A | * | 1/1999 | Jaspers | 206/718 |
| 5,931,629 A | * | 8/1999 | Rodier | 414/413 |
| 5,997,236 A | * | 12/1999 | Picioccio et al. | 414/403 |
| 6,071,067 A | * | 6/2000 | Boon et al. | 414/797.8 |
| 6,074,158 A | * | 6/2000 | Yutaka et al. | 414/416.07 |
| 6,340,282 B1 | * | 1/2002 | Bar et al. | 414/788.7 |
| 6,385,842 B1 | * | 5/2002 | Davis, III | 29/740 |

FOREIGN PATENT DOCUMENTS

CH 631911 * 9/1982

* cited by examiner

*Primary Examiner*—James W. Keenan
(74) *Attorney, Agent, or Firm*—Morgan, Lewis & Bockius LLP

(57) ABSTRACT

A portable tube holder apparatus and tube loading method facilitates safe and rapid loading of tubes containing electronic components into a machine. The tube holder has a tube guide sized to receive a plurality of tubes and a support to selectively hold the tubes in that guide. The holder can be loaded with a relatively large number of tubes at a workstation area and then used to safely transport the tubes to the machine without risk of the components falling out of the tubes. The support, which is preferably slidable, permits all of the tubes in the guide to be readily released into the machine's feeding system, enabling fast loading of the machine and also minimizing down-time for machines that cannot run while being loaded. The portable tube holder preferably has an interface designed to facilitate alignment of the tube holder's guide with the feeding system guide in the machine.

19 Claims, 11 Drawing Sheets

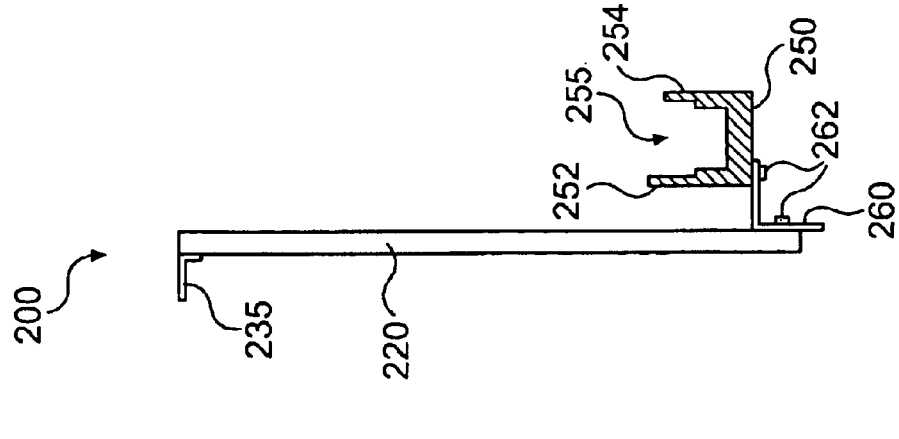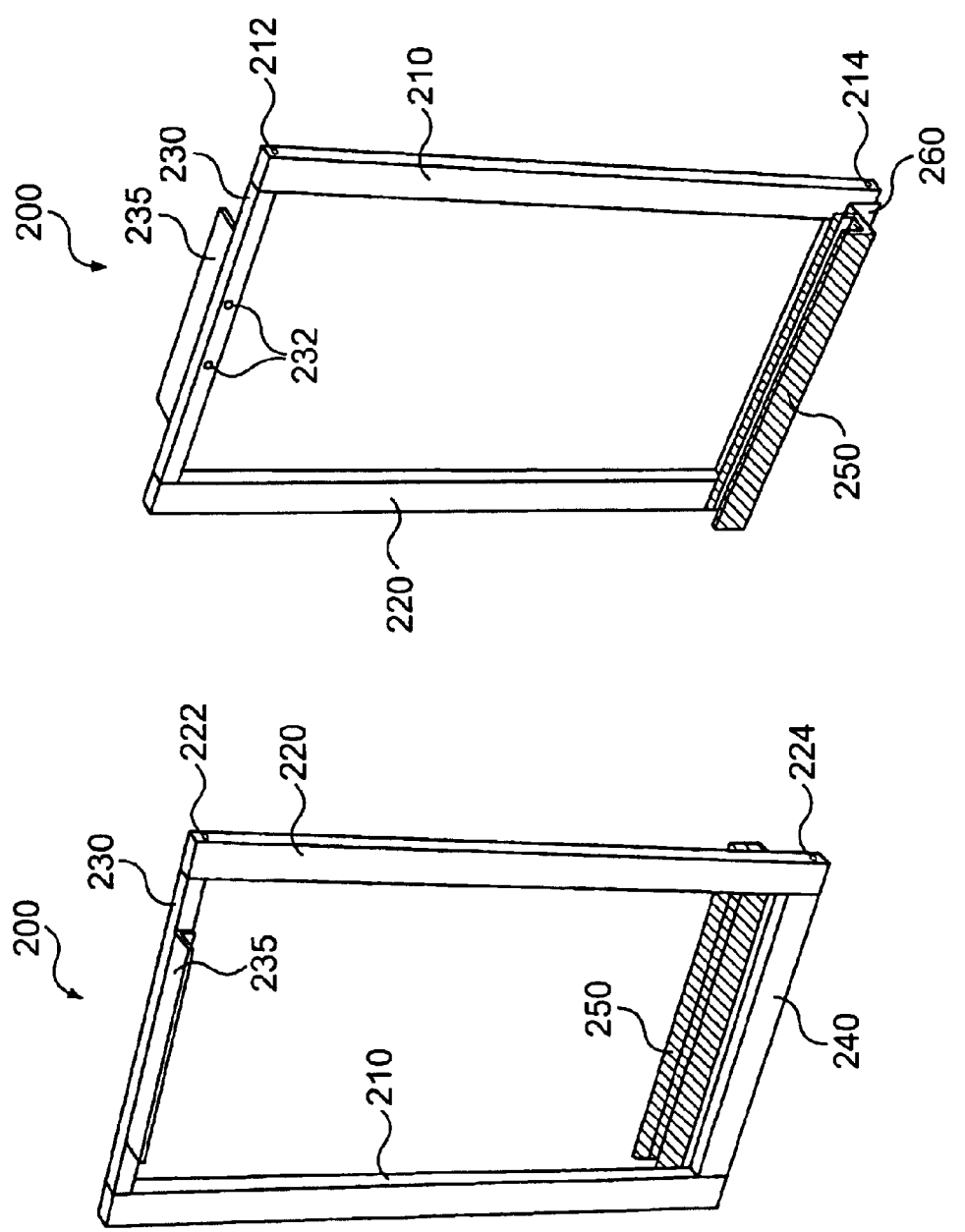

PORTABLE TUBE HOLDER APPARATUS

FIELD OF THE INVENTION

The present invention relates to electronic component packaging and testing. More particularly, it relates to an apparatus for loading tubes into a machine, the tubes typically contain electronic components and the machine typically performs high-volume packaging and/or testing of those components.

BACKGROUND OF THE INVENTION

It is generally desirable for electronic components, such as integrated circuit devices, to be handled, tested, packaged, and distributed in bulk quantities. This is necessary to reduce costs and better accommodate high-volume assembly into larger electronic systems using automatic pick-and-place equipment. For example, in one popular high volume packaging technology, components are packaged within a reel of tape. A "tape and reel" machine receives the components at a feeder of the machine and, after optionally testing the components, inserts the components into a length of tape having pockets appropriately sized to receive the components. The tape pockets are sealed as components are secured within them, and the tape is then wound on a reel by the device. One such tape and reel machine is the Ismeca™ MP-200 manufactured by Ismeca U.S.A. Inc. in Vista, Calif.

To feed electronic components into a high-volume packaging/testing machine such as the Ismeca MP-200, the components are first initially inserted into elongated plastic tubes appropriately sized to receive such components. The machine has a feeding system that typically includes a pair of guide rails capable of holding several tubes at once. The guide rails are a fixture of the machine and typically extend upwardly—usually vertically, but in some cases at a lesser inclination. The lowermost tube in the guide rails lies in a feed-ready position for the machine, and each other tube within the guide rails rests on the one below it. During operation, the machine periodically pulls in the lowermost in the guide rails, and the remaining tubes then descend down the guide rails so that another tube is ready to be fed into the machine when needed. From each fed tube, the machine unloads the components from the tube before performing the necessary component testing and/or packaging. The feeding of tubes continues in this manner until the machine's feeding system guide rails are empty. Exemplary tube feeding systems are disclosed in U.S. Pat. Nos. 4,862,578 and 6,071,067.

Due to the physical layout and size restrictions of most machines, the size of the feeder guide rails is limited and, in most cases, they are only able to hold a maximum of 40–50 tubes at one time. In addition, to limit the handling of electronic components by a loading technician and consequent potential damage to the components, components are generally inserted into tubes at a more appropriate work station area, before the tubes are transported to the machine and then loaded individually into the machine's feeding system. As a result, the loading of tubes into a machine's feeding system is typically a laborious task requiring a technician to make repeated trips between the work station and the machine. In addition, since in many cases the tubes do not have plugs at their ends, when a tube is transported by a technician from the loading station to the machine, components can easily slide out of the tube, fall and become damaged—even where a technician takes great care to keep the tube level during transport. Although in some cases plugs can be inserted at one or both ends of a tube to protect against the falling out of components, extra steps are required to insert the plugs. Moreover, since the feeding systems of many machines require that the tubes be plug-free, removing such plugs at a machine is a difficult and precarious task for a technician and risks further damage to components.

Furthermore, many packaging and testing machines (such as the Ismeca MP-200) have a door that needs to be opened to provide access to the feeding system during tube loading, but must be closed while the machine operates. In such cases, continuous loading is not possible since the tubes can only be loaded into the machine while it is not running. This undesirably results in lengthy loading delays during which the machine does not run.

Consequently, there is a need for an apparatus and method for facilitating the safe loading of tubes into packaging and/or testing machines and particularly for reducing the down-time of machines that must be turned off when tubes are being loaded.

SUMMARY OF THE INVENTION

The present invention provides a tube holder apparatus and tube loading method for facilitating the safe and rapid loading of tubes containing electronic components into a component packaging and/or testing machine. Since the tube holder of the present invention is portable, it is not permanently fixed to and is readily removable from the machine. Thus, instead of individually transporting and loading tubes at a machine, the portable tube holder of the present invention can be conveniently loaded with a relatively large number of tubes at a workstation area and then used to safely transport all of the tubes to a component packaging/testing machine without any risk of the components falling out of the tubes. Furthermore, the portable tube holder enables all of the tubes it holds to be readily released into the machine's feeding system, thereby providing for rapid loading of the machine's feeding system. In addition, since the portable tube holder can be loaded with tubes while the machine is running, costly down-time for machines that cannot run while being loaded is minimized.

The portable tube holder includes a tube guide sized to receive a plurality of tubes and a support that selectively holds the tubes in that guide. The portable tube holder also preferably has an interface that is designed to facilitate alignment of the tube holder's guide with the feeding system guide of the packaging/testing machine. The interface may comprise feet, connected to the bottom of the tube guide, having bottom surfaces designed to dovetail (i.e., interlock) with walls of the feeding system guide of the machine.

In one embodiment, the guide comprises a frame having first and second ends, a first end guide rail connected to the first end of the frame, and a second end guide rail connected to the second end of the frame. More particularly, the frame of the guide may comprise a top frame member having first and second ends and a bottom frame member having first and second ends. In this case, the first end guide rail is connected between the first end of the top frame member and the first end of the bottom frame member, and the second end guide rail is connected between the second end of the top frame member and the second end of the bottom frame member.

The support preferably comprises a support slide having a frame and a cradle for supporting a lowermost tube in the tube guide (each of the remaining tubes in the tube guide rests on the one below it). Preferably, the support slide frame is slidably mounted to a center portion of the tube guide and the cradle extends from a location below the tube guide for each slidable position of the support slide. A clamp may be connected to the tube guide to selectively prevent sliding of the support slide when it is in a clamped position. Also, the support slide may include a handle connected to a top portion of the support slide frame. The handle enables sliding of the support slide to be manually controlled by a tube loading technician. In addition, one or more abutting members (e.g., blocks) may be connected to the guide frame, so that (in at least some positions of the slide frame) they are in contact with the support slide frame and provide frictional resistance against the movement of the support slide with respect to the guide.

BRIEF DESCRIPTION OF THE DRAWINGS

The objects and advantages of the present invention will be more readily apparent when considered in conjunction with the following detailed description and accompanying drawings which illustrate, by way of example, preferred embodiments of the invention and in which:

FIG. 1A is a cross-sectional view of the tube along the line A—A in FIG. 1;

FIG. 7 is a front perspective view of a tube support slide of the portable tube holder FIG. 3;

FIG. 8 is a back perspective view of the tube support slide;

FIG. 9 is a side view of the tube support slide;

DETAILED DESCRIPTION OF THE PREFERRED EMBODIMENTS

Figure 1:
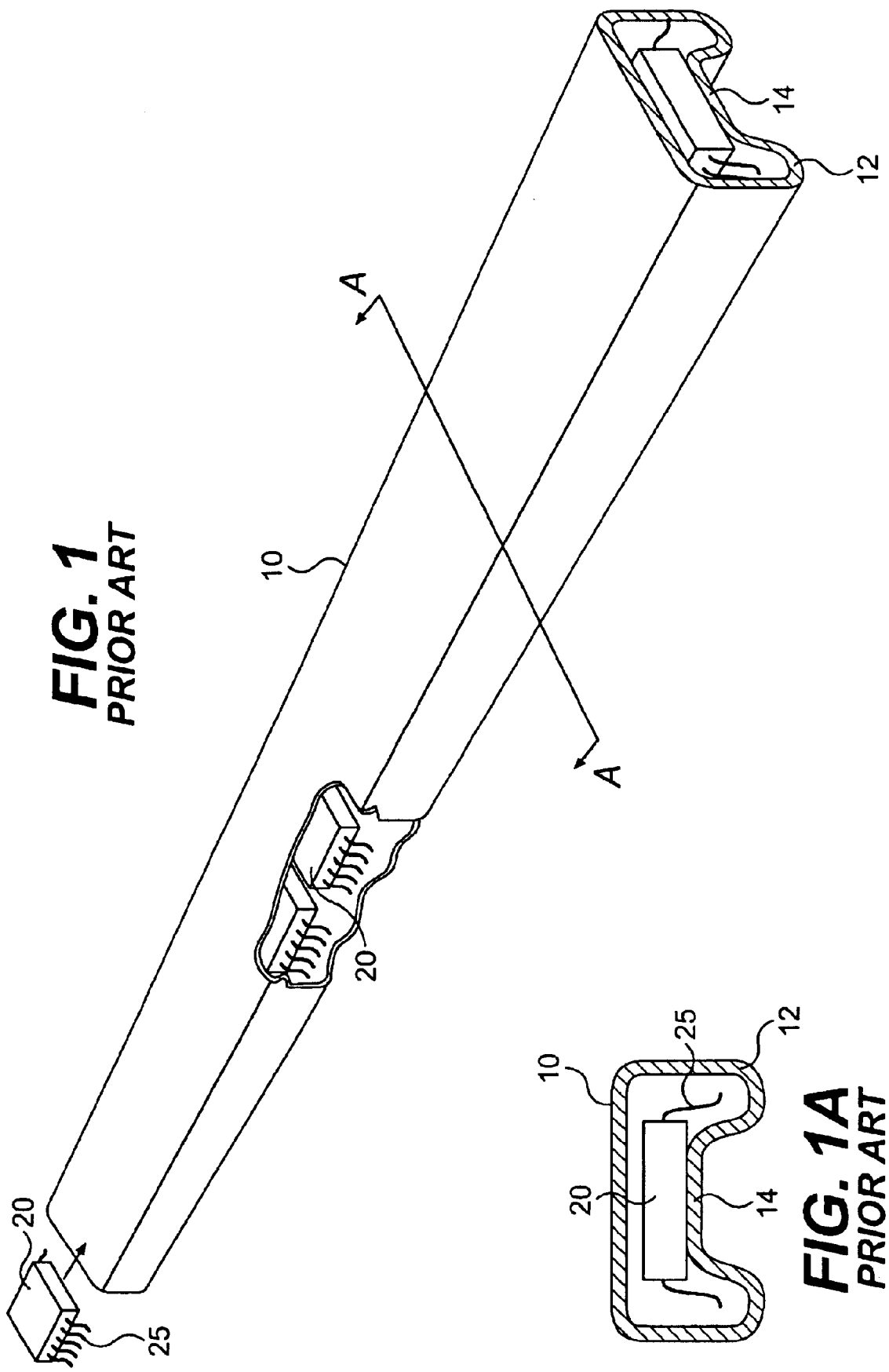
FIG. 1 is a perspective view of a conventional tube holding several electronic components.

FIG. 1 is a perspective view of a conventional elongated hollow tube 10 designed to hold a large number of electronic components 20 within it. FIG. 1A is a cross-sectional view of the tube along the line A—A in FIG. 1. Tube walls 12 are dimensioned to accommodate the size and type of electronic component, and components 20 are typically inserted into an end of tube 10 and distributed along the tube until the entire length of tube 10 contains components. The insertion of components into tubes 10 is typically performed by an automated test-handler machine. In FIGS. 1 and 1A, components 20 are packaged integrated circuits having electrical leads 25 that extend out of the package. In this case, walls 12 of tube 10 may include a raised bottom perimeter section 14 that supports the package body of components 20 and ensures that component leads 25 are not damaged as components 20 slide into and out of tube 10. Generally, tubes of various cross-sectional shapes and sizes and of various lengths are available, for example from ITW Thielex in Arlington, Tex.

Figure 2:
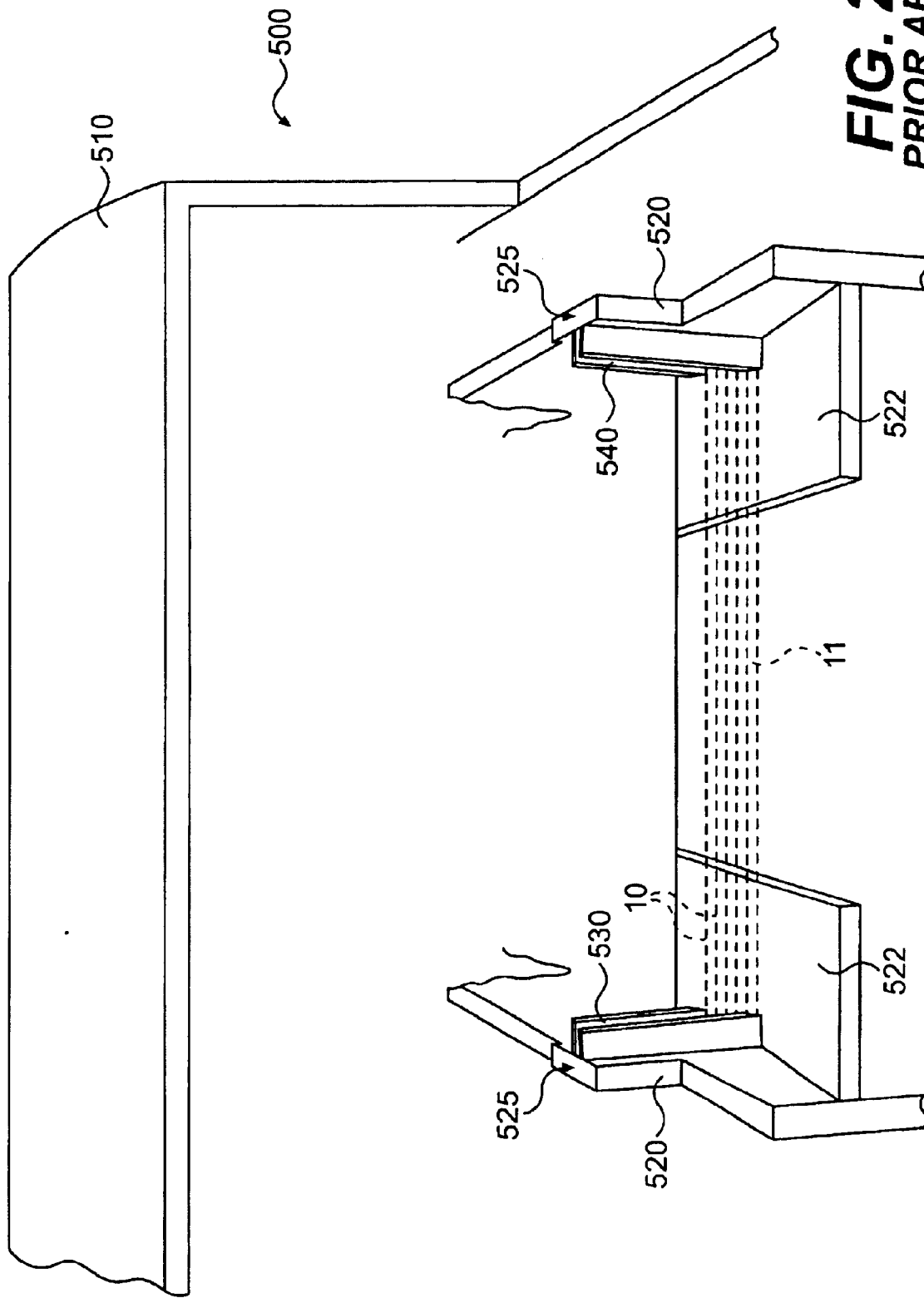
FIG. 2 is a perspective view a typical component packaging/testing machine's feeding system designed to receive the tubes in FIG. 1.

FIG. 2 is a perspective view a typical component packaging/testing machine's feeding system 500 that is designed to receive tubes 10. For clarity of illustration, only a few tubes 10 are shown in dotted outline in FIG. 2. Referring to FIG. 2, the machine's feeding system 500 is included along with the other parts (not shown) of the machine within a housing 510. In the illustrated embodiment, machine feeding system 500 is located between two internal side walls 520. A first guide rail 530 runs vertically along one side wall, and a second guide rail 540 runs vertically along the other side wall. Guide rails 530 and 540 form the machine's feeding system tube guide. Side walls 520 are separated by an appropriate distance so that tubes 10 of a desired length can be received within the feeding system guide rails without risk of components falling out. A tube 11 at the bottom of the machine's feeding system guide is supported by two platforms 522 located at the base of guide rails 530 and 540, with each additional tube resting on the one below it. Feeding system platforms 522 may be of any suitable configuration so long as tubes within the machine's feeding system guide are supported above them. When the machine operates, the lowermost tube in feeder guide is pulled into the machine by a conveyor or other mechanism that then empties components from the tube so that they can be packaged, tested, etc. as required. However, the details of tube-feeder mechanism of machine are not shown in FIG. 2 for clarity. Feeding system 500 is generally similar to the tube feeding systems found in many electronic component packaging/testing machines such as, for example, the Ismeca MP-200 machine. As noted above, in conventional loading techniques the tubes are filled with components at a work station and then transported to the machine and inserted into its feeding system one (or perhaps a small number) at a time.

In accordance with the present invention a portable tube holder is provided that can be conveniently loaded with a relatively large number of tubes at a workstation area and then used to safely transport all of those tubes to a component packaging/testing machine without the risk of components falling out of the tubes. The portable tube holder is also designed to permit all of the tubes it carries to be readily released into the machine's feeding system enabling rapid loading of the machine and minimizing down time for machines that cannot run while being loaded. As described below, the portable tube holder may have an interface—preferably, a set of dovetailing feet—designed to facilitate alignment of the tube holder's guide with a feeding system guide of the packaging/testing machine.

Figure 3:
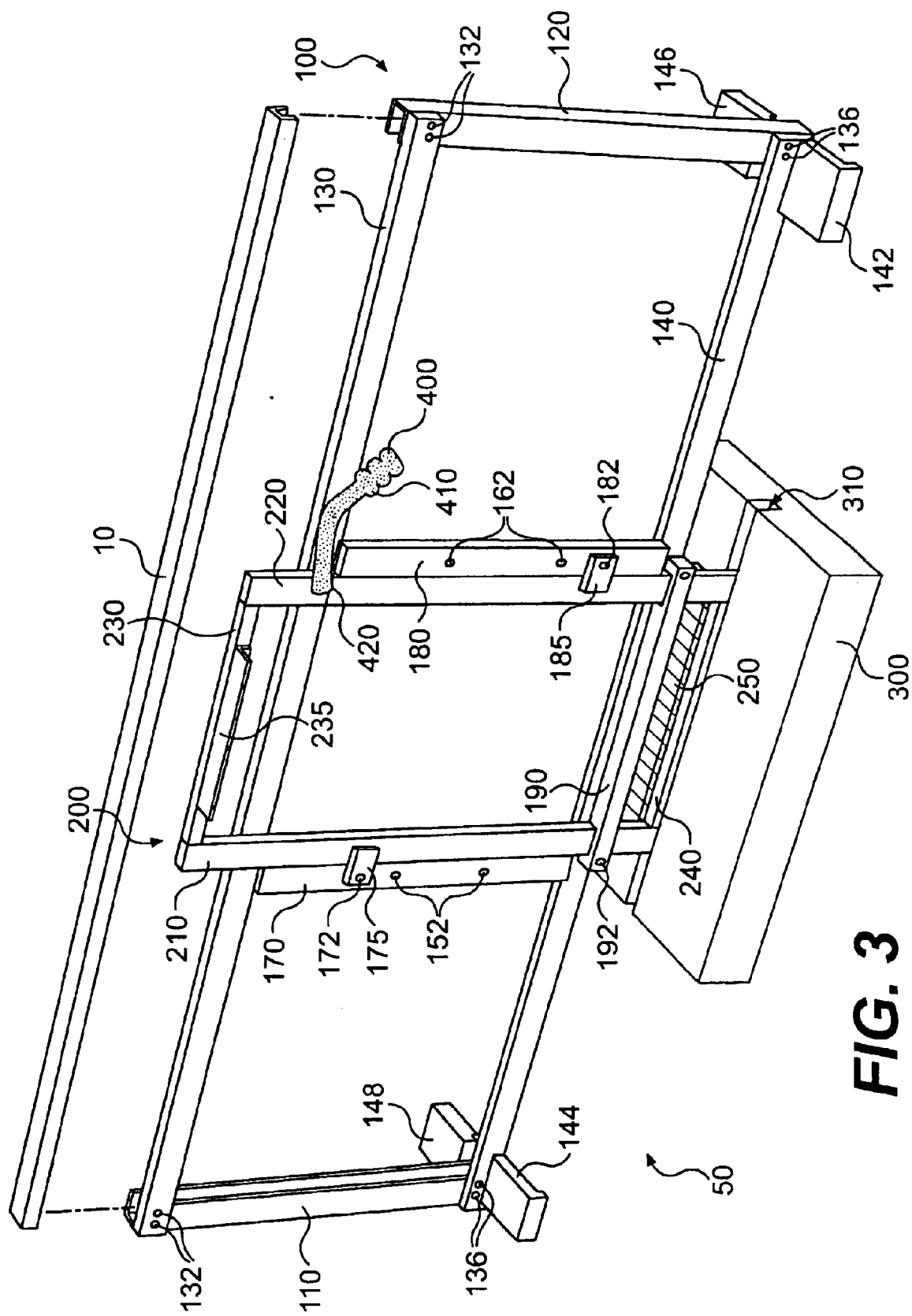
FIG. 3 is a front perspective view of a portable tube holder in accordance with a preferred embodiment of the invention.
Figure 4:
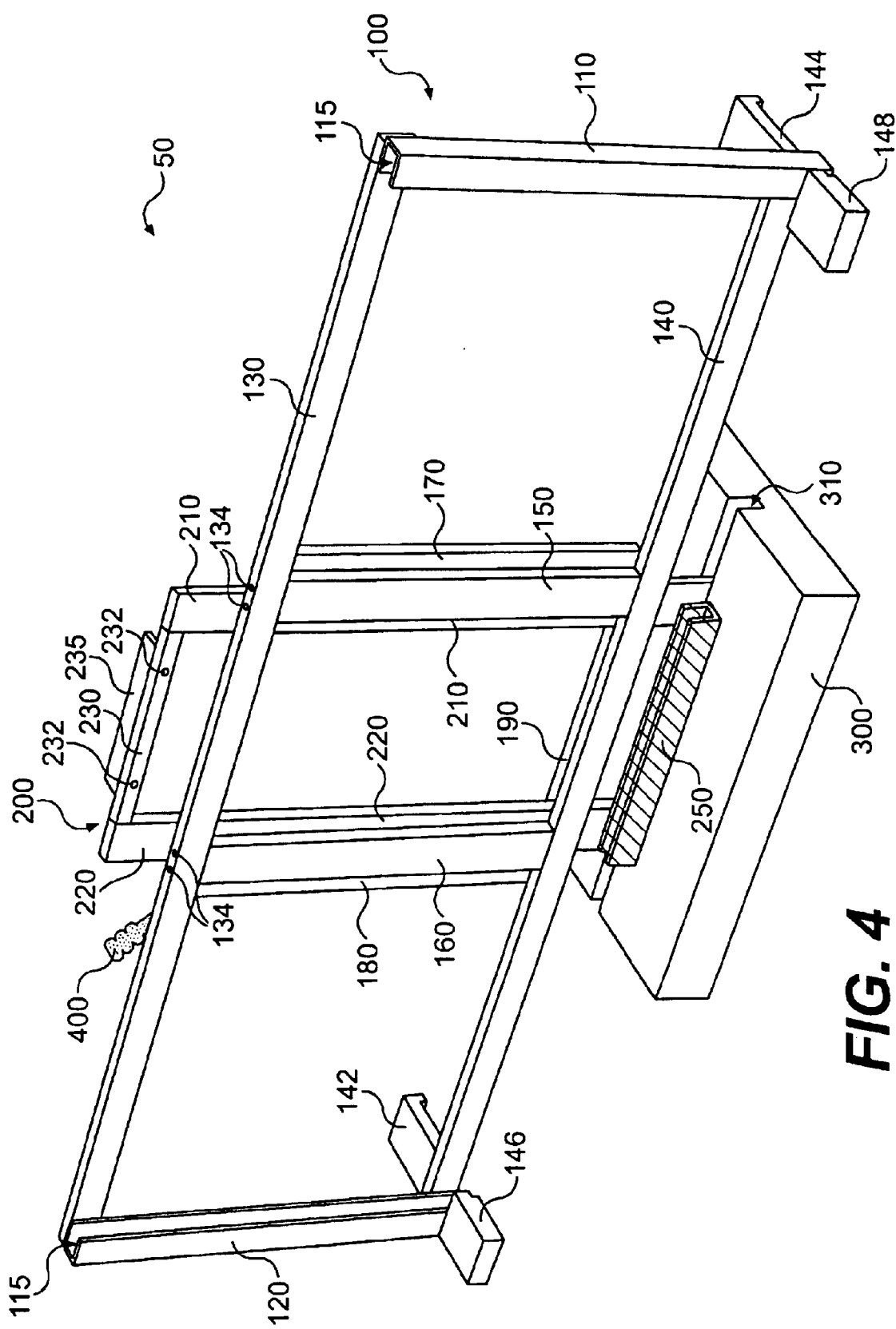
FIG. 4 is a back perspective view of the portable tube holder of FIG. 3.
Figure 5:
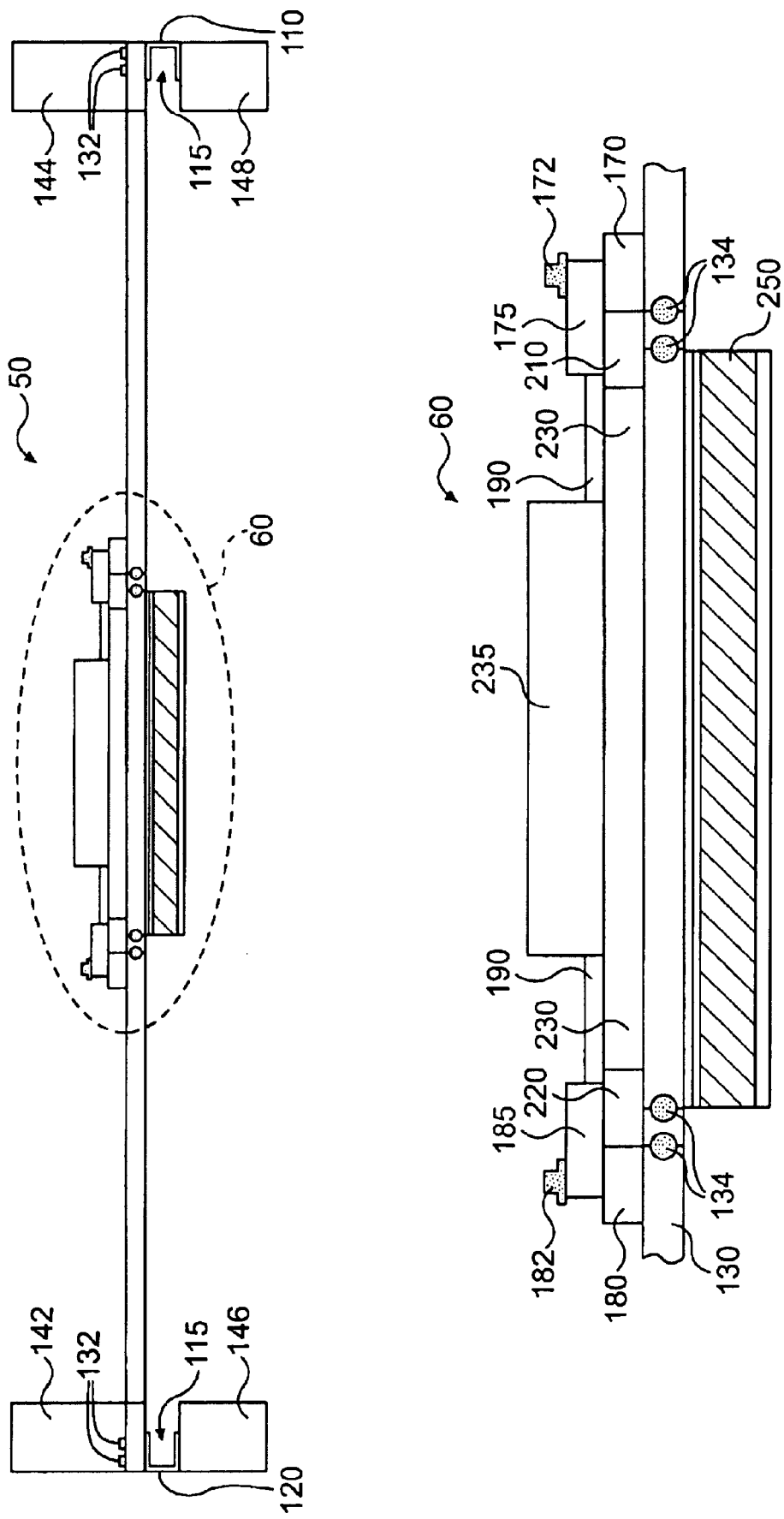
FIG. 5 is a top view of the portable tube holder of FIG. 3 including a magnification of a central section thereof.
Figure 6:
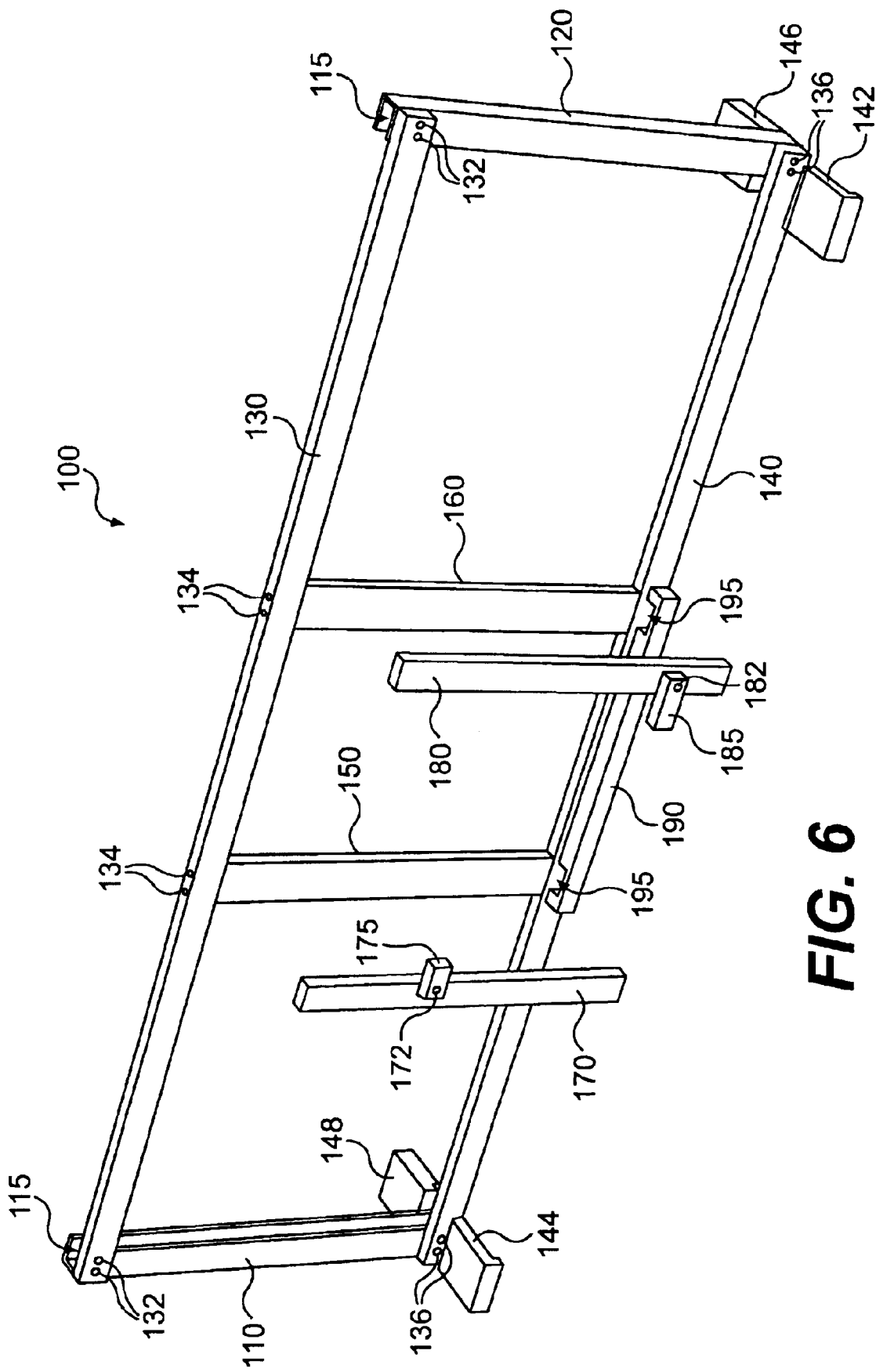
FIG. 6 is a front perspective and partially exploded view of a tube guide of the portable tube holder of FIG. 3.
Figure 10:
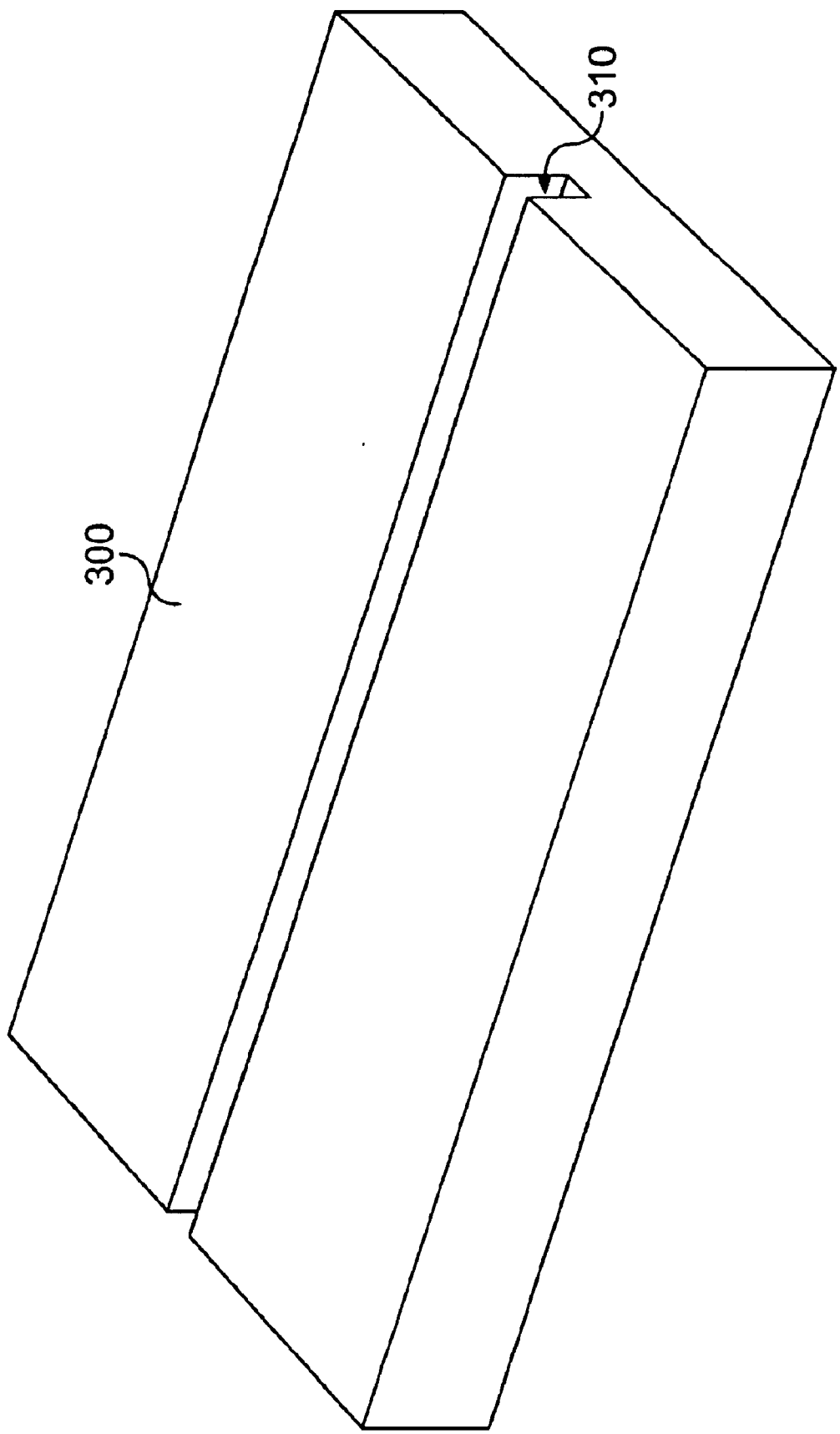
FIG. 10 is a perspective view of an accompanying base stand for the portable tube holder of FIG. 3.

FIG. 3 is a front perspective view, FIG. 4 is a back perspective view, and FIG. 5 is a top view of a portable tube holder 50 in accordance with a preferred embodiment of the present invention. (In the top view of FIG. 5, a central section 60 of portable tube holder 50 is magnified for clarity.) Portable tube holder 50 generally comprises a tube guide 100 for receiving tubes 10, and a tube support slide 200 that supports tubes within guide 100 and that is operable to move up and down along guide frame 100. FIG. 6 is a front perspective, and partially exploded, view of tube guide 100. FIGS. 7–9 are, respectively, a front perspective view, back perspective view, and side view of tube support slide 200. As shown in FIGS. 3 and 4, portable tube holder 50 preferably has an accompanying base stand 300 for facilitating the initial loading of tubes into holder 50, typically at a loading station area. FIG. 10 is a perspective view of base stand 300, which is preferably rectangular-shaped and has a relatively thin opening 310 running along a center median line. In addition, tube holder 50 also preferably includes a releasable clamp 400 that allows the movement of support slide 200 to be selectively prevented, particularly when holder 50 is being transported from a loading station area to a tube-receiving machine. Note that, for clarity of illustration, clamp 400 is not shown in the top view of FIG. 5.

The various components of portable tube holder 50 may be formed from metal, preferably aluminum or from other materials such as plastic. Also, as described below, conventional securing means, such as screws, are preferably used to connect the various components together. However, welding and other connection techniques may also be used.

Referring to the drawings, tube guide 100, comprises a first end guide rail 110, a second end guide rail 120, a top guide frame member 130, and a bottom guide frame member 140. Top guide frame member 130 is secured to end guide rails 110 and 120 by way of securing means 132 which may be screws, bolts, pins or any other suitable component. Similarly, bottom guide frame 140 is secured to end guide rails 110 and 120 by way of securing means 136. Thus, in the illustrated embodiment, rails 110 and 120 are connected to frame members 130 and 140 to generally form a rectangular guide frame. As shown, end guide rails 110 and 120 each has a U-shaped opening 115 that faces the other opening 115. Guide frame members 130 and 140 may be rods with rectangular cross-sections, as shown. The length of top and bottom guide frame members 130 and 140 effectively determine the length of tube guide 100 and is chosen to accommodate a desired length of tube 10. More specifically, the length of guide 100 is generally selected so that each end of a tube 10 entering guide 100 is located within one of the end guide rail openings 115, and therefore end guide rails 110 and 120 constrain the tube to movement up and down guide 100. The length of end guide rails 110 and 120 effectively determine the height of tube guide 100 and therefore the number of tubes that may be held in tube guide 100 at one time. Tube guide 100 has two frontward-extending feet 142 and 144 secured to bottom guide frame member 140. Foot 142 is located near rail 120, and foot 144 is located near rail 110. Guide 100 also has two backward-extending feet 146 and 148 that are secured to the bottom of end guide rail 120 and the bottom of end guide rail 110 respectively. As described below, the bottom of surfaces of feet 142, 144, 146, and 148 are preferably uneven and designed to dovetail with corresponding parts of a machine feeding system, allowing holder 50 to sit firmly and stably on top of the feeding system with end guide rails 110 and 120 aligned with the feeding system guide rails.

In the illustrated embodiment, tube guide 100 also includes two vertical guide frame members 150 and 160, two vertical slide adjustment members 170 and 180, and a horizontal slide mounting member 190—all of which may have a rectangular cross section, as shown. Slide adjustment members 170 and 180 and slide mounting member 190 are shown in exploded view (i.e., apart from the remainder of guide 100) in FIG. 6. As best seen in FIG. 6, vertical guide frame members 150 and 160 are secured between top guide frame member 130 (by way of securing means 134) and bottom guide frame member 140 (by way of additional securing means—not shown). As shown, members 150 and 160 preferably have the same thickness as members 130 and 140 so that the front and back surfaces of those members are flush with one another. As best illustrated in FIGS. 7 and 8, tube support slide 200 comprises a rectangular frame formed from two vertical frame members 210 and 220, a top frame member 230 and a bottom frame member 240. Each of members 210, 220, 230, and 240 may be a rod having a rectangular cross-section, as shown. Slide frame member 210 is secured to top frame member 230 by securing means 212 and to bottom frame member 240 by securing means 214 (FIG. 8). Similarly, slide frame member 220 is secured to member 230 by securing means 222 and to member 240 by securing means 224 (FIG. 7). The length of members 210 and 220 (i.e., the height of slide 200) is greater than the length of guide rails 110 and 120, (i.e., the height of guide 100). A support slide handle 235 is also secured to top frame member 230 by securing means 232. Handle 235 extends in the forward direction from tube support slide 200. As shown in FIG. 9, a tube cradle 250 is mounted to the back side of bottom frame member 240 by way of an L-shaped bracket 260. Bracket 260 is secured to member 240 and to cradle 250 by way of securing means 262. Tube cradle 250 is horizontally offset from the remainder of support slide 200 so that it will be aligned with guide rails 110 and 120 when slide 200 is mounted onto guide 100. The configuration of tube cradle 260 is not critical, since cradle 260 generally need only have some surface or mechanism for supporting the lower most tube. Preferably, however, tube cradle 250 has a first wall 252 and a second wall 254 that together form a U-shaped opening 255 sized to receive, along the length of cradle 250, a center portion of a tube 10. As shown, interior wall 252 may be somewhat higher than exterior wall 254 and both walls 252 and 254 may be stepped, so that opening 255 narrows near its bottom. The stepped shaped of opening 255 helps preclude the possibility of a tube 10 turning on its side when entering tube cradle 250.

Referring back to FIGS. 3–5, when portable tube holder 50 is assembled, the frame of tube support slide 200 is placed in front of the frame of guide 100 with tube cradle 250 located below bottom guide frame member 140 and aligned with guide rails 110 and 120. With support slide 200 placed in this position, horizontal slide mounting member 190 is secured to bottom guide frame member 140 by way of securing means 192. Openings 195 (see FIG. 6) in slide mounting member 190 are sized to receive each of slide frame members 210 and 220, so that when member 190 is secured to member 140, support slide 200 is fastened to tube guide 100. Although member 190 serves to mount tube support slide 200 to guide 100 in this manner, member 190 generally does not impede the vertical movement of slide 200 between a minimum height slide position and a maximum height slide position. At the slide 200's minimum height position, the bottom surface of top slide frame member 230 hits against the top surface member 190 so that further slide movement downward is prevented; whereas at its maximum height slide position, the top surface of bottom slide frame member 240 hits against the bottom surface member 190 so that further slide movement upward is prevented. It should be noted that, at the maximum height slide position, the height of tube cradle 250 is such that a tube supported by cradle 250 remains contained by end guide rails 110 and 120 in tube guide 100.

As shown in the back perspective view of FIG. 4, the distance between vertical slide frame members 210 and 220 is less than that between the vertical guide frame members 150 and 160. Slide adjustment members 170 and 180 are positioned so that slide 200 fits relatively tightly between members 170 and 180 with only small spacing on each side (see FIG. 3). Slide adjustment member 170 is secured to vertical guide frame member 150 by way of securing means 152, and slide adjustment member 180 is secured to vertical guide frame member 160 by way of securing means 162. Slide adjustment members 170 and 180 are preferably of the same thickness as slide frame members 210 and 220 so that the back surfaces of those members are flush, as illustrated in the top view of FIG. 5. As shown in FIG. 3, an abutting member 175 is attached—preferably rotatably—to slide adjustment member 170 via securing means 172 so that member 175 abuts against the front surface of slide frame member 210. Similarly, an abutting member 185 is attached—again, preferably rotatably—to slide adjustment member 180 via a securing means 182 so that member 185 also abuts against the front surface of slide frame member 220. Abutting members 175 and 185, which may be blocks of rubber or another resilient material, provide frictional resistance against the movement of support slide 200 with respect to guide 100. The amount of frictional resistance may be varied by tightening (or loosening) securing means 172 and 182. In this manner, greater control over the movement of support slide 200 may be given to a person operating portable tube holder 50. For example, abutting members 175 and 185 may be tightened to provide enough frictional resistance so that, even when tube guide 100 is filled with tubes 10, an operator must first overcome an initial static frictional resistance to begin moving support slide 200 downward.

As noted above, to selectively enable the movement of slide 200, portable tube holder 50 also preferably includes a releasable clamp 400, most clearly seen in FIG. 3. Clamp 400 prevents any movement of slide 200 in a first, i.e., clamped, position but does not interfere with the movement of slide 200 in a second, i.e., unclamped, position. As shown in FIG. 3, clamp 400 is preferably attached to the front surface of top tube guide frame member 130 and includes a hand-actuated lever 410 for operating clamp 400 between the clamped and unclamped positions. In known manner, in the clamped position, a part 420 of clamp 400 serves to firmly hold slide frame member 230 against guide frame member 130. In one embodiment, clamp 400 is a hold-down action clamp such as a De-Sta-Co™ Series No. 205 clamp. Although use of clamp 400 is preferred, a technician could alternatively simply hold handle 235 to manually clamp support slide 200 when holder 50 is being transported.

Prior to loading component-containing tubes 10 into guide 100, holder 50 is first preferably inserted into base stand 300 by placing a bottom portion of support slide 200, including bottom slide frame member 240 and part of bracket 260, into opening 310. This is best seen in FIG. 4. Base stand 300 is generally heavier than tube holder 50 and has a flat bottom surface and can conveniently sit on a work-desk or other level surface. Without base stand 300, holder 50 may be unable to sit in a stable manner on a flat surface since cradle 250 and guide frame feet 142, 144, 146, and 148 generally do not provide support evenly (the feet also preferably have uneven bottom surfaces for interfacing with a machine feeding system, as described below).

With holder 50 placed on stand 300, support slide 200 is preferably moved to (or near) its maximum height position, and clamp 400 preferably clamps slide 200 in that position. The depth of base stand opening 310 is preferably such that the bottom surface of tube cradle 250 preferably rests on (or is slightly above) the surface of stand 300 when holder 50 is in the stand. When a first tube 10 containing components is inserted into tube guide 100, the tube moves down along the guide until it is supported by tube cradle 250 at the bottom of guide 100. Preferably, the tube is not dropped down guide 100, but rather lowered by hand by a technician facing the back side (see FIG. 4) of tube holder 50. Each tube 10 subsequently inserted into guide 100 is also moved down the guide until it comes to rest on the tube below it. In this manner, guide 100 can be filled with tubes 10 up to the capacity of guide 100 (the latter will depend on the height of guide 100 and the size of tubes 10).

Once filled to capacity (or with a lesser number of tubes, if desired), a technician may grab portable tube holder 50 at handle 235 (or at another suitable location such top guide frame member 130) and easily transport holder 50 and the tubes it holds to a desired component packaging/testing machine. As indicated above, the length of guide 100 is preferably selected to be only slightly larger than the length of tubes 10, so that end guide rails 110 and 120 prevent the possibility of components falling out of open-ended tubes while the tubes are being inserted into guide 100 and especially while holder 50 is being transported from one location to another.

Once tube holder 50 is brought to a packaging/testing machine, it enables the tubes it carries to be quickly transferred to a feeding system guide in the machine. To do so, guide 100 needs to be aligned with the feeding system guide. In a preferred embodiment, the bottom surfaces of feet 142, 144, 146, and 148 are designed to allow holder 50 to sit firmly and stably atop the feeding system to smoothly interface and align end guide rails 110 and 120 with the guide rails of the feeding system. It will be appreciated that different types of interfaces may be used for tube holder 50 depending on the construction and orientation of the guide in a machine's tube feeding system. In addition, in some cases, the machine's feeding system can be physically altered—without affecting the operation of the feeding system—to better enable a secure interfacing of the two guides.

Figure 11:
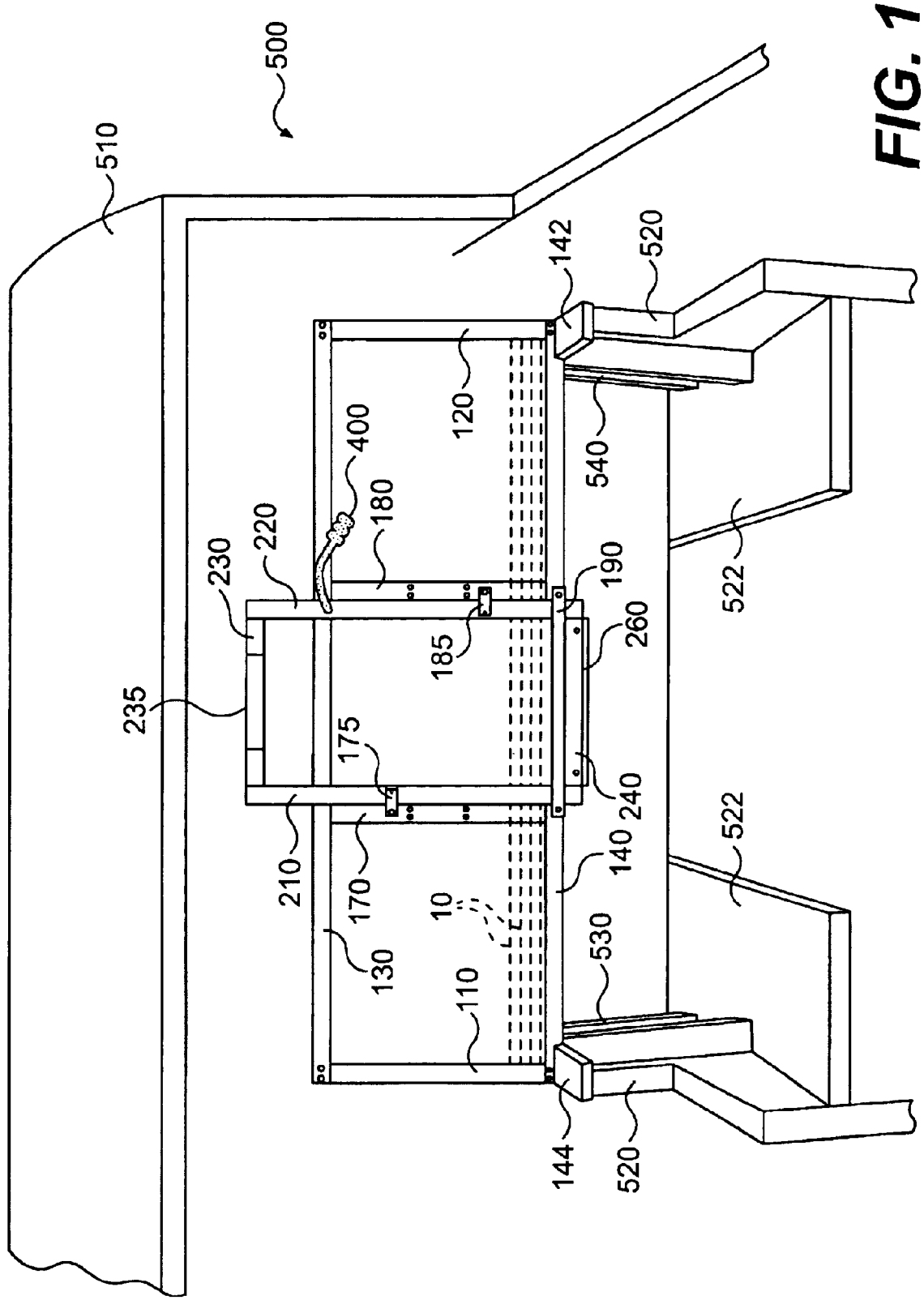
FIG. 11 is a perspective view of the portable tube holder of FIG. 3 positioned on the machine feeding system of FIG. 2 prior to the unloading of tubes into the feeding system.
Figure 12:
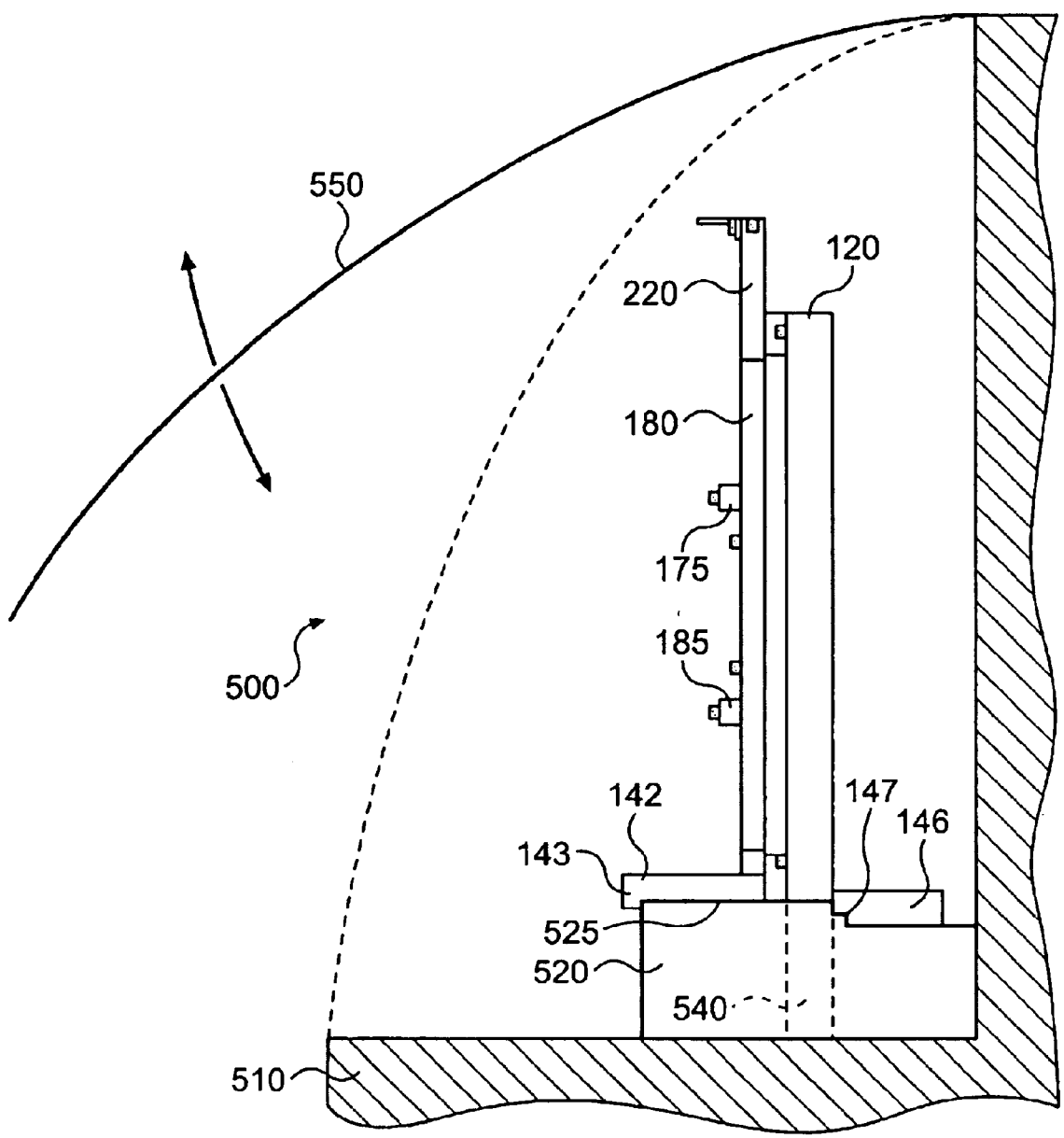
FIG. 12 is a side view of the portable tube holder of FIG. 3 positioned on the feeding system in FIG. 11.

FIG. 11 is a perspective view of an embodiment in which tube holder 50 is positioned on the component packaging/testing machine feeding system 500 of FIG. 2 (as shown, the front side of tube holder 50 faces out of the machine). In FIG. 11, holder 50 is shown prior to the unloading of tubes 10 into machine feeding system 500. As in FIG. 2, for clarity of illustration, only a few tubes 10 are shown in dotted outline in FIG. 11. FIG. 12 is a side view better illustrating how the feet on each side of tube holder 50 dovetail with the feeding system side walls 520 to facilitate alignment of tube guide rails 110 and 120 with the machine's feeder guide rails 530 and 540 respectively. As illustrated in FIG. 12, the machine may be of a type that requires that an access door 550 be opened to load tubes into feeding system 500 but remain closed while the machine operates. As shown in FIG. 12, frontwardly extending foot 142 and backwardly extending foot 146 of holder 50 are designed to dovetail with (i.e., provide a close fit over) an upper surface 525 of the side wall 520 along which guide rail 540 runs. In particular, a projection 143 of foot 142 and a projection 147 of foot 146 can be positioned to fit closely over ledges of the side wall allowing holder 50 to sit firmly atop those walls. If desired, more intricate dovetailing by way of several interlocking projections and corresponding mortises in the feet and side wall may also be employed. Once the feet of tube holder 50 are properly dovetailed (i.e., interlocked) on top of side walls 520, holder 50 sits firmly on walls 520 and is effectively prevented from moving forwards or backwards. Therefore, to be removed from feeding system 500, the feet of holder 50 must be lifted in an upward direction. As shown in FIG. 12, in the dovetailed position, end guide rail 120 in holder 50 aligns smoothly with machine guide rail 540. In a similar manner, feet 144 and 148 dovetail with the other side wall 520 so that end guide rail 110 aligns smoothly with machine guide rail 530.

Figure 13:
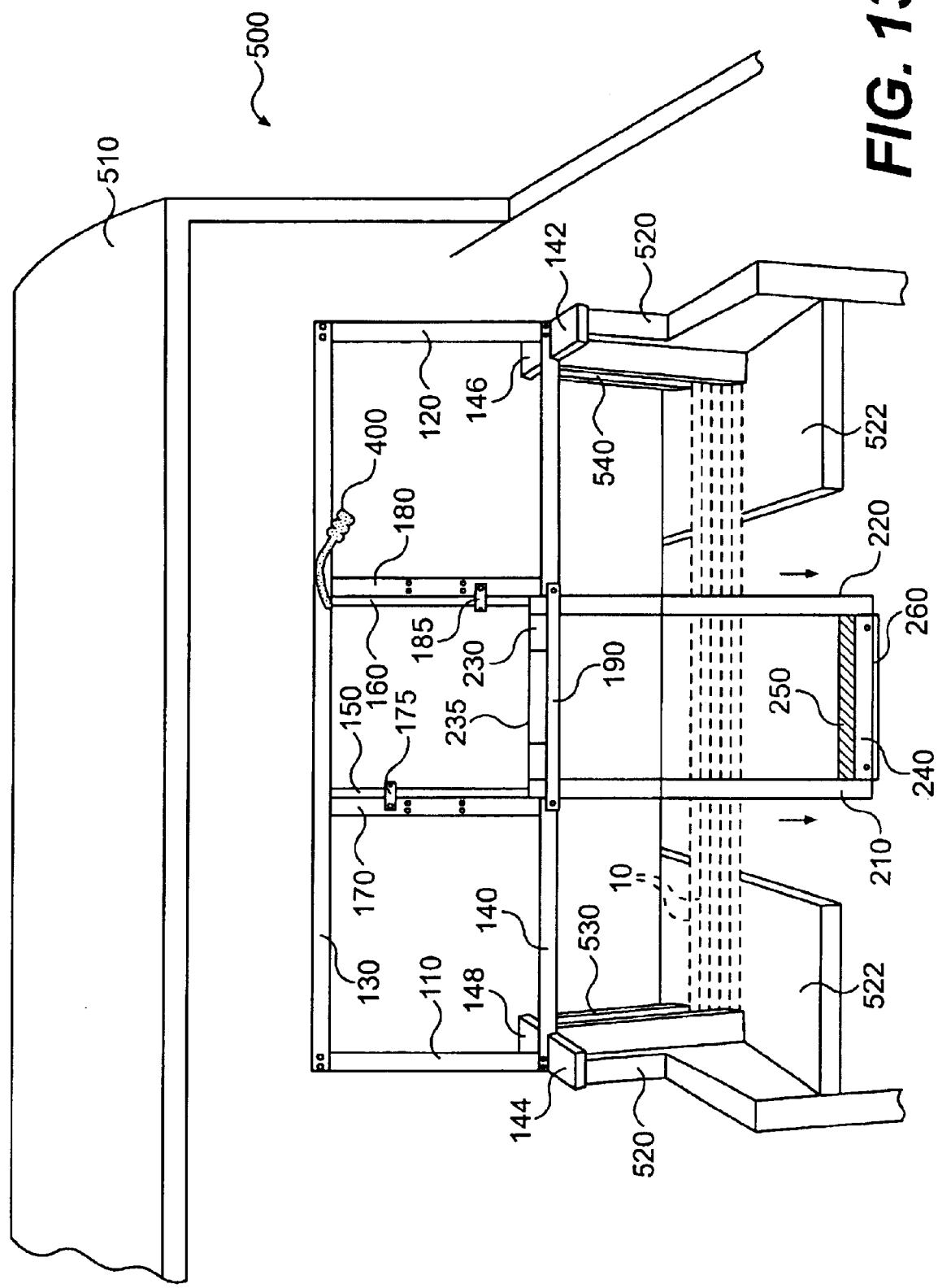
FIG. 13 is a perspective view of the portable tube holder of FIG. 3 positioned on the machine feeding system of FIG. 2 after the unloading of tubes into the feeding system.

Once portable tube holder 50 sits firmly in the dovetailed position with guide 100 properly aligned with the guide in feeding system 500, tubes 10 in holder 50 can be unloaded by releasing clamp 400 and lowering support slide 200. A technician standing in front of machine feeding system 500 can conveniently lower slide 200 while holding handle 235. As slide 200 is lowered, tubes 10 leave guide 100 and enter the guide in feeding system 500. Optionally, since tubes 10 are generally light weight, a dummy tube-shaped weight may be placed on top of the tubes 10 in holder 50 so that the additional weight ensures a smooth movement of tubes 10 down guide 100. As slide 200 is lowered beneath the level of platforms 522, the tubes are no longer supported by slide 200 and instead rest above feeder platforms 522. This is illustrated in FIG. 13. FIG. 13 is similar to FIG. 11 but shows portable tube holder 50 after slide 200 has been lowered below the level of platforms 522. Note that, in a preferred embodiment, there is space between platforms 522 in feeding system 500 for part of slide 200 to move below the level of platforms 522 without obstructing feeding system 500 or any other part of the machine. (If this space is not present in feeding system 500, support 200 may employ another tube-releasing mechanism that does not require that space.) As shown in FIG. 13, tubes 10 are now held in the guide of feeding system 500, i.e., within rails 530 and 540. Preferably the tube-holding capacity of guide 100 in holder 50 is as large as the tube-holding capacity of feeding system 50 so that one such tube exchange can fill the feeding system guide. Once support slide 200 is lowered sufficiently to provide significant clearance between it and tubes 10, holder 50 may be lifted upward off of walls 520 and out of feeding system 500 without obstructing any part of the machine. If a dummy weight was used it is removed at this stage and, if necessary, feeding system door 550 is closed before the machine begins operating.

By loading tubes 10 into feeding system 500 in the manner, the number of trips an operator must make between a loading station and a component packaging/testing machine is significantly reduced, since, preferably, only one trip must made to load the feeding system to its capacity. Furthermore, since tubes 10 may be loaded into portable tube holder 50 while the machine is running and since the tubes may then be rapidly transferred from holder 50 to the machine's feeding system, down-time is minimized for machines that cannot operate while being loaded. Moreover, holder 50 protects against the falling out of components during tube loading and, particularly, during transportation from a loading station to the machine.

Many possible changes and modifications may be made to portable tube holder 50, and more specifically to guide 100, support slide 200 and the feeding system interface formed by feet 142, 144, 146, and 148. For example, though not preferable, support slide 200 may be replaced by a simple tube release mechanism at the bottom of guide 100 that, when released, simply drops tubes in guide 10 into the machine's feeding system guide. Alternatively, a support slide may slide down the feeding system guide but not below it (as in FIG. 13). In this case, when the support cradle is near the feeding system's tube support level (e.g., the level of platforms 522 in FIG. 13), it may be released out of the guide so that tubes 10 fall only a small distance. Guide 100 only needs to constrain tubes 10 to movement within the guide and therefore is not required to have any particular structure. Also, to accommodate tubes of different lengths, e.g., tubes being fed to different machines, guide 100 may be designed to have an adjustable length that by replacing the above-described guide frame members with an extendable/retractable guide frame. In addition, in some component packaging/testing machines, the feeding system guide is not oriented vertically with respect to the ground (as above) but at a lesser inclination, e.g., at an angle of 45° to the ground. For such feeding systems, portable tube holder 50 can be modified so that guide 100 is oriented at the same angle as the feeding system guide and, preferably, so that the feet (or some other suitable) interface allows the two guides to be readily aligned.

Other embodiments and modifications will be readily apparent to one of ordinary skill in the art in light of the above description, in which only preferred embodiments of the invention have been shown and described. Accordingly, the drawings and description are to be regarded as illustrative in nature, and not restrictive.

What is claimed is:

1. An apparatus for loading tubes into a machine comprising:

a tube guide sized to receive a plurality of tubes;

a support coupled to the guide, the support selectively holding the plurality of tubes in the guide;

an interface connected to the tube guide and configured to facilitate alignment of the guide with a feeding system guide of the machine;

and wherein the apparatus is portable and the interface comprises feet connected to the bottom of the tube guide having bottom surfaces designed to dovetail with walls of the feeding system guide of the machine.

2. The apparatus of claim 1 wherein the guide comprises:

a frame having first and second ends;

a first end guide rail connected to the first end of the frame; and a second end guide rail connected to the second end of the frame.

3. The apparatus of claim 2 wherein the frame of the guide comprises a top frame member having first and second ends and a bottom frame member having first and second ends, the first end guide rail being connected between the first end of the top frame member and the first end of the bottom frame member, and the second end guide rail being connected between the second end of the top frame member and the second end of the bottom frame member.

4. The apparatus of claim 2 wherein the support comprises a support slide having a frame and a cradle for supporting a lowermost tube in the tube guide, the support slide frame being slidably mounted to a center portion of the tube guide.

5. The apparatus of claim 4 wherein one or more abutting members are connected to the guide frame, wherein, in at least some slidable positions of the support slide, the one or more abutting members are in contact with the support slide frame and provide frictional resistance against the movement of the support slide with respect to the guide.

6. The apparatus of claim 1 wherein the support comprises a support slide having a frame and a cradle for supporting a lowermost tube in the tube guide, the support slide frame being slidably mounted to a center portion of the tube guide.

7. The apparatus of claim 6 wherein the support slide is mounted on a front side of the tube guide, and the cradle extends from a location below the tube guide for each slidable position of the support slide.

8. The apparatus of claim 6 further comprising a clamp connected to the tube guide for selectively preventing sliding of the support slide when in a clamped position.

9. The apparatus of claim 6 wherein the support slide further comprises a handle connected to a top portion of the support slide frame for manually controlling sliding of the support slide.

10. The apparatus of claim 1 wherein the guide is oriented substantially vertically.

11. The apparatus of claim 1 wherein each of the tubes contains a plurality of electronic components.

12. The apparatus of claim 1 wherein the tube guide has ends for preventing components within the tubes from falling out of the tubes.

13. A method of loading tubes into a machine using the apparatus of claim 1, the method comprising:

loading a plurality of tubes into the support of claim 1;

transporting the portable apparatus with the plurality of tubes to the machine; and releasing the plurality of tubes from the portable apparatus into a tube feeding system of the machine.

14. The method of claim 13 comprising:

positioning the portable apparatus on top of the tube feeding system of the machine prior to releasing the plurality of tubes into the feeding system.

15. The method of claim 14 wherein positioning the portable apparatus atop the tube feeding system further comprises aligning a guide in the portable apparatus with a guide in the tube feeding system.

16. An apparatus for loading tubes into a machine comprising:

a tube guide sized to receive a plurality of tubes;

a support coupled to the guide, the support selectively holding the plurality of tubes in the guide;

wherein the support comprises a support slide having a frame and a cradle for supporting a lowermost tube in the tube guide, the support slide frame being slidably mounted to a center portion of the tube guide; and wherein the apparatus is portable.

17. The apparatus of claim 16 further comprising a base stand having an opening for receiving a bottom portion of the support slide.

18. A portable apparatus for loading tubes into a machine comprising:

means for receiving a plurality of tubes;

means for selectively holding the plurality of tubes in the receiving means; and means for aligning the receiving means with a feeding system guide of the machine, the aligning means comprising at least two feet connected to the bottom of the receiving means, the feet having bottom surfaces designed to dovetail with a wall of the feeding system guide of the machine to load the plurality of tubes into the machine.

19. The apparatus of claim 18 wherein the holding means comprises means for sliding the plurality of tubes out of the tube receiving means and the apparatus further comprises means for selectively preventing sliding of the sliding means.

* * * * *